(12) United States Patent
Bauer et al.

(10) Patent No.: US 7,919,857 B2
(45) Date of Patent: Apr. 5, 2011

(54) PLASTIC HOUSING AND SEMICONDUCTOR COMPONENT WITH SAID PLASTIC HOUSING

(75) Inventors: Michael Bauer, Nittendorf (DE); Peter Strobel, Regensburg (DE); Jens Pohl, Bernhardswald (DE); Christian Stuempfl, Schwandorf (DE); Ludwig Heitzer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 580 days.

(21) Appl. No.: 11/867,132

(22) Filed: Oct. 4, 2007

(65) Prior Publication Data
US 2008/0045063 A1   Feb. 21, 2008

Related U.S. Application Data (63) Continuation of application No. PCT/DE2006/000541, filed on Mar. 27, 2006.

(30) Foreign Application Priority Data

Apr. 4, 2005 (DE) .......... 10 2005 015 455

(51) Int. Cl.
H01L 23/06 (2006.01)
H01L 23/552 (2006.01)
H01L 21/00 (2006.01)
(52) U.S. Cl. ............... 257/729; 257/E23.114; 438/125
(58) Field of Classification Search .......... 257/678, 257/701–702, 729, E23.001, E23.114, 685–690; 438/125–126
See application file for complete search history.

(56) References Cited

U.S. PATENT DOCUMENTS

| | | | |
|---|---|---|---|
| 5,045,436 A | 9/1991 | Tieke et al. | |
| 5,646,072 A | 7/1997 | Maudie et al. | |
| 5,948,991 A | 9/1999 | Nomura et al. | |
| 7,009,288 B2 | 3/2006 | Bauer et al. | |
| 2003/0068496 A1 | 4/2003 | Wei et al. | |
| 2003/0203205 A1* | 10/2003 | Bi et al. ............... | 428/402 |
| 2004/0020674 A1* | 2/2004 | McFadden et al. ...... | 174/35 MS |
| 2004/0240191 A1* | 12/2004 | Arnold et al. .......... | 361/800 |
| 2005/0045358 A1* | 3/2005 | Arnold ................. | 174/51 |
| 2006/0091522 A1 | 5/2006 | Bachmaier et al. | |

FOREIGN PATENT DOCUMENTS

| | | |
|---|---|---|
| DE | 4238113 A1 | 5/1994 |
| DE | 19740389 | 3/1999 |
| DE | 102004019428 A1 | 8/2005 |
| DE | 102004045854 A1 | 4/2006 |
| WO | 2004004006 A1 | 1/2004 |
| WO | 2006026951 A1 | 3/2006 |
| WO | 2006050709 A1 | 5/2006 |

OTHER PUBLICATIONS

Nils Heininger et al., "Fertigung von MID Bauteilen vom Rapid Prototyping bis zur Serie mit innovativer LDS-Technologie," Ricone Symposium, Oct. 1, 2003, Murnau, Germany; XP-002395995.

* cited by examiner

Primary Examiner — Savitri Mulpuri
Assistant Examiner — Calvin Choi
(74) Attorney, Agent, or Firm — Edell, Shapiro & Finnan, LLC (57) ABSTRACT

A plastic housing includes plastic external faces and the underside of the plastic housing comprises external contact areas on which external contacts are arranged. The plastic external faces are covered by a closed metal layer apart from the underside, wherein the boundary layer between plastic external faces and the closed metal layer includes exposed electrically conductive inclusions of the plastic of the housing.

16 Claims, 5 Drawing Sheets

PLASTIC HOUSING AND SEMICONDUCTOR COMPONENT WITH SAID PLASTIC HOUSING

CROSS REFERENCE TO RELATED APPLICATIONS

This application is a continuation of International Application No. PCT/DE2006/000541, filed on Mar. 27, 2006, entitled "Plastic Housing and Semiconductor Component Comprising Said Type of Plastic Housing in Addition to a Method for the Production Thereof," which claims priority under 35 U.S.C. §119 to Application No. DE 102005015455.7 filed on Apr. 4, 2005, entitled "Plastic Housing and Semiconductor Component Comprising Said Type of Plastic Housing in Addition to a Method for the Production Thereof," the entire contents of which are hereby incorporated by reference.

BACKGROUND

Plastic housings and semiconductor components including plastic housings are known to comprise plastic external faces and external contact areas fitted with external contacts arranged on an underside of the plastic housing. Plastic housings of this type have the disadvantage that semiconductor structures packed therein are exposed to electromagnetic interference fields since plastic materials are not able to shield the sensitive semiconductor structures from such interference fields and, consequently, do not always fulfill the EMC standards (electromagnetic compatibility standards).

A known plastic housing includes shielding films arranged therein, which are arranged within a plastic housing composition both on the active top side of a semiconductor chip and on the passive rear side of the semiconductor chip in order to protect the sensitive integrated circuits of the semiconductor chip against electromagnetic stray fields. The arrangement of shielding films geometrically adapted to the semiconductor chip within a plastic housing requires a complicated, cost-intensive manufacturing technique which does not always lead to the desired shielding protection.

SUMMARY

Described herein, is a plastic housing and a semiconductor component comprising the type of plastic housing. The plastic housing comprises plastic external faces and external contact areas fitted with external contacts arranged on an underside of the plastic housing. Likewise, a method for producing a semiconductor component comprising the type of plastic housing is described herein. The plastic housing comprises plastic external faces and the underside of the plastic housing comprises external contact areas on which external contacts are arranged. The plastic external faces are covered by a closed metal layer apart from the underside, wherein the boundary layer between plastic external faces and the closed metal layer comprises exposed electrically conductive inclusions of the plastic of the housing.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

The invention will now be explained in more detail with reference to the accompanying figures, where:

FIGS. 7-10 show schematic cross sections through components of a semiconductor component, in the course of producing a semiconductor component, of a second embodiment;

DETAILED DESCRIPTION

Described herein, is a plastic housing which reliably shields against electromagnetic interference fields and can be produced cost-effectively. Furthermore, the shielding is intended to be able to be adapted to different plastic housing geometries without major outlay in terms of manufacturing technology.

The plastic housing comprises plastic external faces and external contact areas fitted with external contacts arranged on an underside of the plastic housing. Likewise, a semiconductor component comprising the type of plastic housing and a method for producing the same are described herein.

The plastic housing of a semiconductor component includes plastic external faces and external contact areas with external contacts arranged on an underside of the component. The remaining plastic external faces are covered by a closed metal layer, wherein the boundary layer between plastic external faces and closed metal layer comprises exposed electrically conductive inclusions of the plastic of the housing.

One advantage of this plastic housing is that it is covered by a closed metal layer which perfectly protects the sensitive integrated circuits—embedded in the plastic housing—of corresponding semiconductor chips against electromagnetic stray radiation. In this case, the structure, the arrangement and the number of the plastic external faces of the plastic housing can be varied as desired, since the closed metal layer can be applied to all exposed electrically conductive inclusions of a plastic housing.

A further advantage is that the metal of the closed metal layer can be chosen freely, such that, for a shielding of magnetic fields, optionally nickel, iron or cobalt metal layers can be deposited on the exposed electrically conductive inclusions of the boundary layer. For a shielding with respect to electromagnetic waves, in particular metals having good conductivity, such as copper, can be used for the closed metal layer. In this case, it is advantageous to connect the closed metal layer to a ground potential in order to achieve a reliable shielding with respect to electromagnetic interference sources.

In a further exemplary embodiment, the exposed electrically conductive inclusions of the boundary layer are covered by a first metal layer having a thickness of a few nanometers. In such a metal layer having a thickness of a few nanometers, the transition from the exposed electrically conductive inclusions of the plastic of the housing that are arranged in isolated fashion to a closed, covering, solid metal layer which can be used in an advantageous manner for a deposition of a far thicker metallic shielding layer is created. The first metal layer having a thickness of a few nanometers can be applied via a sputtering method.

It is furthermore provided that the first metal layer is covered by a second metal layer having a thickness of a few micrometers. The second metal layer can be applied to the first metal layer via chemical deposition or electrodeposition. These deposition methods have the advantage over a plasma deposition or a sputtering deposition since they can reinforce the first metal layer independently of direction (i.e., isotropically).

In one exemplary embodiment, the exposed electrically conductive inclusions in the boundary layer are cleavage products of metal complexes. Metal complexes of this type can be formed by organometallic compounds or by inorganic metal-containing complexes. The inorganic metal-containing complexes are optionally complex salts, while in organometallic compounds the organic radical optionally has a monomer of an organic compound.

In a further embodiment, the exposed electrically conductive inclusions of the boundary layer have metallic nanoparticles. Optionally, the nanoparticles can also be constructed from carbon, and be present in the form of fullerenes.

A further aspect relates to semiconductor components comprising a plastic housing in accordance with the above embodiment. Such a semiconductor component comprising a plastic housing includes on its underside a wiring substrate, which comprises in its edge region at least one large-area external contact area which is electrically connected to the top side of the wiring substrate and to the closed metal layer covering the plastic housing composition. Such a large-area external contact area on the underside of the wiring substrate can be connected to an external contact which is arranged there and which, for its part, can be connected to a ground potential. Consequently, in this exemplary embodiment, the closed metal layer on the top sides of the plastic housing can be electrically connected to a ground potential for shielding the sensitive integrated circuits embedded within the plastic housing composition with a ground potential.

According to the above-described embodiments of the plastic housing, the semiconductor component also has organometallic compounds in its plastic housing composition, the metallic constituents of which compounds are exposed in the boundary layer and are covered by a closed metal layer. As described above, the exposed metallic constituents covered by a closed metal layer can have electrically conductive carbon nanoparticles, optionally fullerenes, which were admixed with the plastic housing composition prior to their processing.

A method for producing a semiconductor component comprising a plastic housing comprising plastic external faces, which includes, arranged on an underside, external contact areas with external contacts, comprises the following method steps. The first step involves mixing a polymer of a plastic housing composition with an inclusion material, which liberates electrically conductive inclusions upon irradiation. The housing of the semiconductor component is subsequently molded from the plastic housing composition.

The electrically conductive inclusions are then liberated with the formation of a boundary layer composed of conductive positions arranged in isolated fashion on the plastic external faces of the plastic housing via irradiation. Finally, the liberated electrically conductive inclusions are reinforced to form a closed first metal layer having a thickness of a few nanometers. This can be followed by an electrodeposition or chemical deposition of a closed second metal layer having a thickness of a few micrometers on the first metal layer.

This method advantageously creates a closed metallic layer on the plastic top sides of the plastic housing, which can serve as a shielding layer for the sensitive integrated circuits of the semiconductor chips embedded into the plastic housing composition. Furthermore, the underside of the semiconductor component can be configured in such a way that a wiring substrate comprises a large-area metal coating in the case of which only the required external contact areas are arranged in a manner isolated from one another, such that corresponding external contacts can be fixed on the external contact areas. The large-area metal coating of the wiring substrate on the underside of the semiconductor component can then likewise be connected to the provided ground potential for the shielding.

Consequently, the semiconductor component is protected against electromagnetic stray fields by a closed shielding. When carrying out the method, optionally an organometallic compound is admixed with the plastic as inclusion material. Such organometallic compounds include metal ions which can be liberated upon correspondingly high-energy irradiation. On the other hand, electrically conductive nanoparticles, optionally fullerenes, can be admixed with the plastic with the plastic as inclusion material. The advantage of the carbon-containing nanoparticles is that they can be incorporated into the plastic of the plastic housing material in isolated fashion, without forming short circuits.

In order to liberate electrically conductive inclusions in a boundary layer, the plastic external faces of the plastic housing are irradiated with photons, ions and/or electrons. Optionally, a laser irradiation or an x-ray irradiation is carried out during the photon irradiation.

The reinforcement of the liberated electrically conductive inclusions to form a lower closed metal layer having a thickness of a few nanometers is optionally effected via sputtering technology and/or plasma deposition at the liberated electrically conductive inclusions. In this case, these methods can be applied over a large area in order to cover all the top sides of the plastic housing composition with a lower closed metal layer having a thickness of a few nanometers.

As previously mentioned above, during the method for producing a closed metallic layer at the external surfaces of a plastic housing, the reinforcement of the lower metal layer to form an upper closed metal layer having a thickness of a few micrometers is carried out via vapor deposition technology and/or via electroless deposition or electrodeposition. While the vapor deposition technology yields a directional vapor deposition and hence a directional anisotropic reinforcement of the metal layer, the electroless depositions or electrodepositions have the advantage that they take place isotropically and can therefore coat the plastic external sides of the plastic housing uniformly.

To summarize, it should be stated that the closed metal coating of the plastic housing composition solves the problem of EMC (electromagnetic compatibility) via shielding for sensitive semiconductor products, in particular for radio frequency components. For this purpose, an organometallic compound or an inorganic metal-containing complex is admixed with the encapsulating material. These complexes or these compounds are so stable that they are cleaved into a metallic and an organic or inorganic constituent only when exposed to a high-energy removing irradiation through laser beams, UV beams, x-ray beams or ion beams. These metallic particles produced by the energy input finally serve as condensation nuclei for a subsequent electrodeposition or electroless deposition of a closed metallic layer on the external side of the plastic housing. In principle, all metals which form complexes or compounds that are stable yet cleavable upon intensive irradiation are appropriate as metals for the complexing. Copper, nickel, palladium, cobalt, magnesium, platinum, iridium, or silver are optionally used for the complexing.

To summarize, the following advantages are thus afforded:
1. A batch process is possible.
2. The complex material can be added to the plastic housing composition directly prior to processing.
3. An improved adhesion of the metal layer on the plastic support is achieved since the metal particles are incorporated into the plastic housing composition.
4. The closed metal layer can additionally be provided with a potential linking, for example, to ground.

In the following paragraphs, exemplary embodiments of the device and method are described in connection with the figures.

Figure 1:
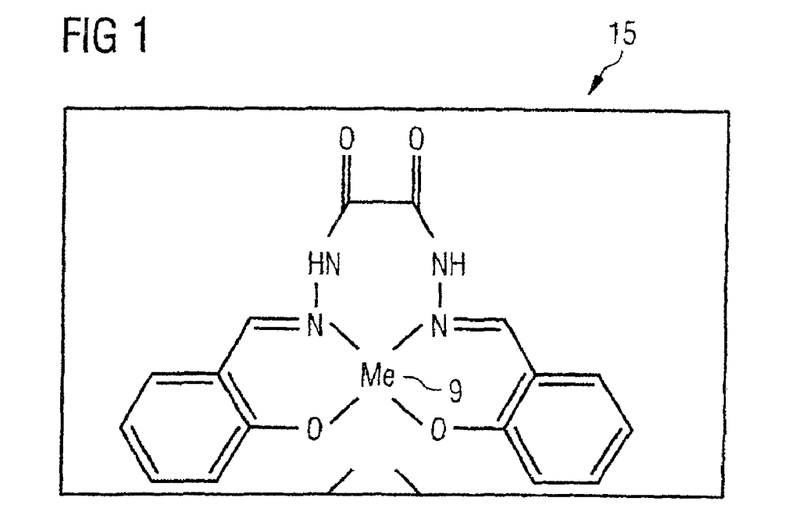
FIG. 1 shows an excerpt from a structural formula of an organometallic compound.

FIG. 1 shows an excerpt from a structural formula of an organometallic compound 15, where the metal ion is denoted by Me. The metals copper, nickel, palladium, cobalt, magnesium, platinum, iridium and/or silver are appropriate as metals Me for the present invention. In general, those metals Me which form metal complexes 14 or compounds that are stable yet cleavable upon intensive irradiation can be used. The metal ions are then liberated as metals Me by irradiation. Instead of the organometallic compounds 15 shown in FIG. 1, metallic particles and/or carbon nanoparticles such as fullerenes and/or carbon-coated nanotubes can also be used as inclusion material into a plastic housing composition in order to form isolated electrically conductive positions.

Figure 2:
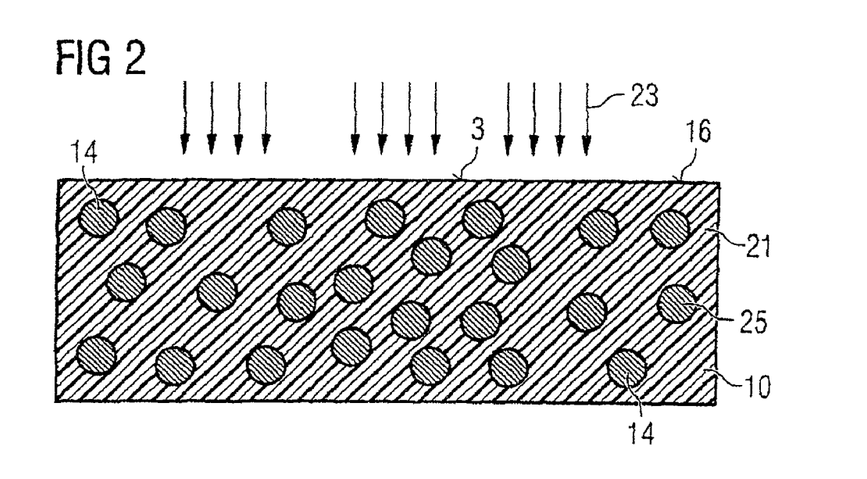
FIG. 2 shows a basic schematic diagram of a plastic housing composition with inclusion material under irradiation.

FIG. 2 shows a basic schematic diagram of a plastic housing composition with inclusion material 25 under the action of an irradiation 23. The symbolically introduced inclusions 9 illustrated in a circular fashion do not represent the true structure of the included electrically conductive particles, rather FIG. 2 merely illustrates that the inclusions 9 are arranged in a manner distributed in the plastic housing composition 21 in a manner isolated from one another. The plastic housing composition 21 forms the plastic 10 of the housing. The irradiation 23 can be, on the one hand, a photon irradiation that can cleave for example metals from an organometallic compound. On the other hand, the irradiation 23 can also have the effect that the plastic housing composition 21 is removed from the plastic external face 3 until conductive positions are exposed on the plastic external face 3.

Figure 3:
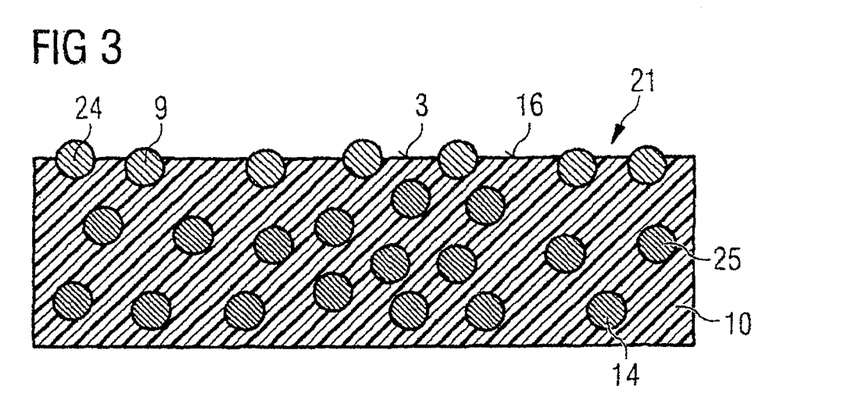
FIG. 3 shows a basic schematic diagram of the plastic housing composition, in accordance with FIG. 2, after the exposure of electrically conductive inclusions as conductive positions on a plastic external face.

FIG. 3 shows a basic schematic diagram of the plastic housing composition 21, in accordance with FIG. 2, after the exposure of electrically conductive inclusions 9 as conductive positions 24 on a plastic external face 3. As a result of this exposure of conductive positions 24, anchorings for a metal layer are predefined on the plastic external face 3, which anchorings can subsequently be converted into a first metal layer having a thickness of a few nanometers by reinforcing and enlarging the conductive positions 24.

Figure 4:
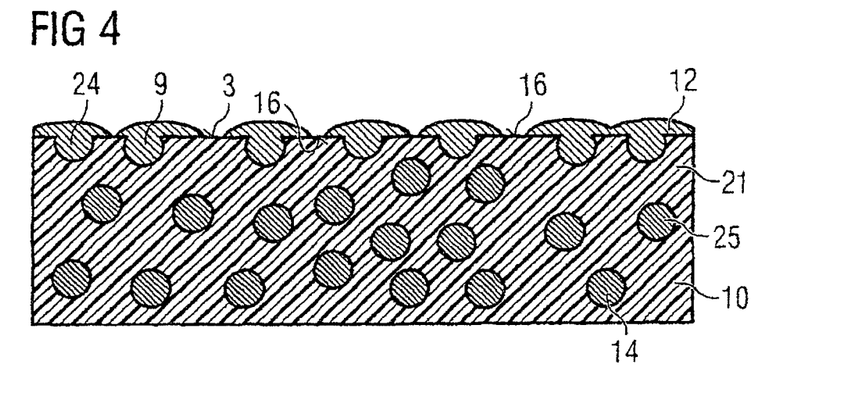
FIG. 4 shows a basic schematic diagram of the plastic housing composition, in accordance with FIG. 3, after a reinforcement of the electrically conductive positions to form a first metal layer.

FIG. 4 shows a basic schematic diagram of the plastic housing composition 21, in accordance with FIG. 3, after a reinforcement of the electrically conductive positions 24. This reinforcement of the electrically conductive positions 24 to form a thin, virtually closed first metal layer 12, or to form a lower metal layer, can be effected by sputtering and/or by plasma deposition of metals on the plastic external faces 3 provided that they include exposed electrically conductive positions 24. After the electrically conductive positions 24 have been reinforced in such a way that they form a closed, conductive first metal layer 12 having a thickness of a few nanometers, the metal layer 12 can be reinforced further to form a second metal layer having a thickness of several micrometers.

Figure 5:
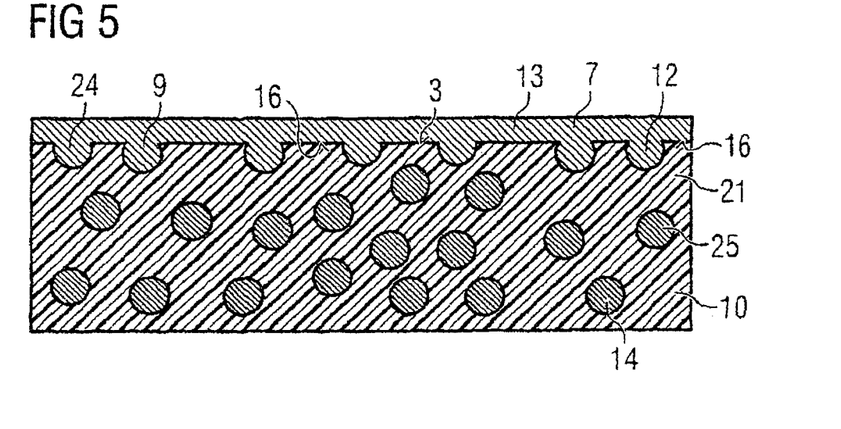
FIG. 5 shows a basic schematic diagram of the plastic housing composition, in accordance with FIG. 4, after the deposition of a second metal layer on the exposed electrically conductive inclusions.

FIG. 5 shows a basic schematic diagram of the plastic housing composition 21, in accordance with FIG. 4, after the deposition of a second metal layer 13 on the first metal layer 12. FIGS. 1 to 5 only show an excerpt from the plastic housing composition 21 on which a closed metal layer 7 is deposited. By contrast, the subsequent figures show the production of corresponding semiconductor components.

Figure 6:
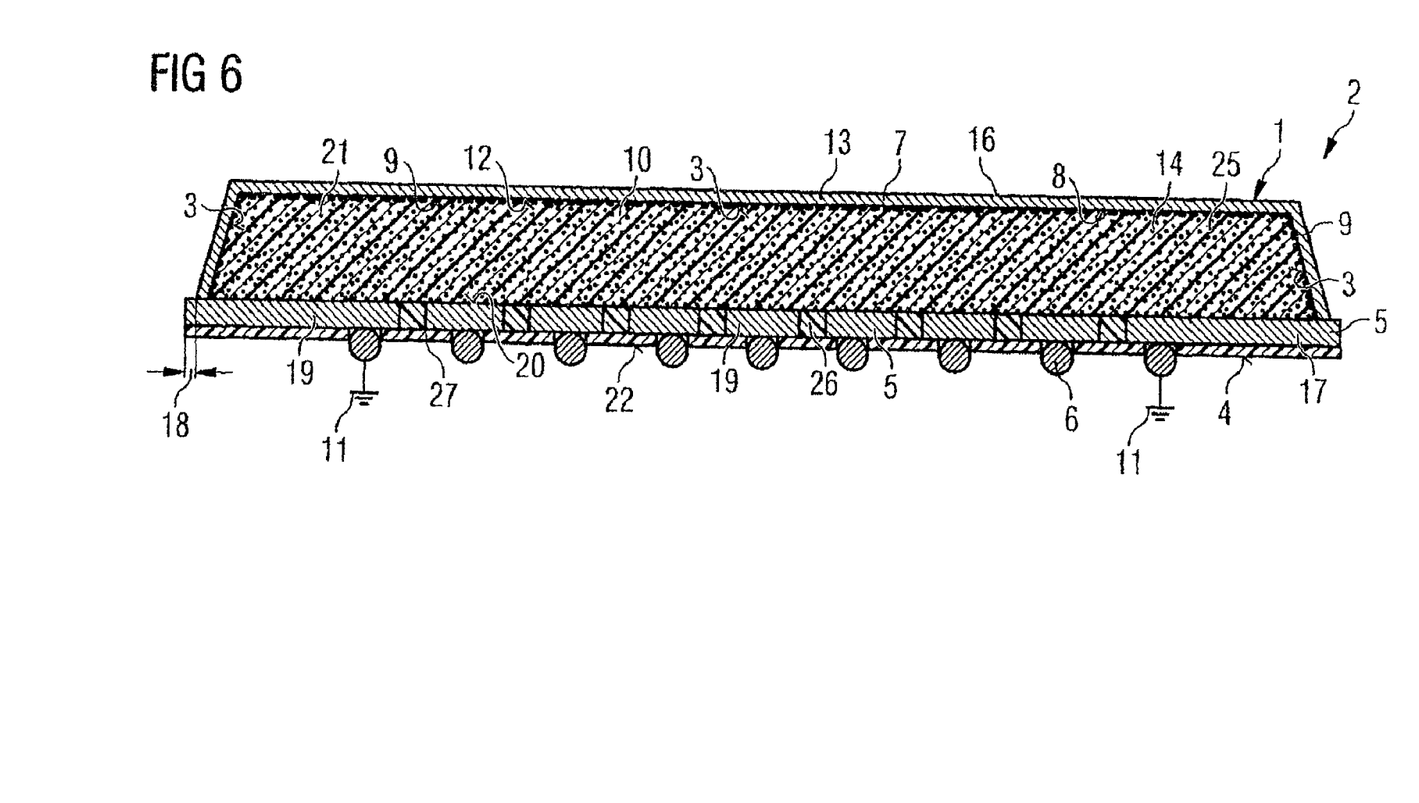
FIG. 6 shows a schematic cross section through a semiconductor component, in accordance with a first embodiment, comprising a plastic housing which is covered by a closed metal layer.

FIG. 6 shows a schematic cross section through a semiconductor component 2, in accordance with a first embodiment, comprising a plastic housing 1 covered by a closed metal layer 7. The metal layer 7 shields the sensitive integrated circuits (not shown) of the semiconductor chips which are embedded in the plastic housing composition 21 of the plastic housing 1 against electromagnetic interference fields. The semiconductor components 2 protected in this way fulfill the EMC standards (i.e., the semiconductor components have a standardized electromagnetic compatibility). The plastic housing composition 21 is arranged on a wiring substrate 17 and comprises metal complexes 14 which are liberated in a boundary layer 8 on the plastic external faces 3 by irradiation to form electrically conductive inclusions 9.

The electrically conductive inclusions 9 form in the boundary layer 8 seeds for a first metal layer 12, which has a thickness of a few nanometers and on which is arranged a second metal layer 13 having a thickness of a few micrometers. This second metal layer 13 having a thickness of a few nanometers can comprise any desired metals; optionally, those metals which increase the shielding are used. Optionally, in order to shield magnetic interference fields, ferromagnetic metals such as iron, nickel or cobalt are used. For the shielding of electromagnetic interference fields, metals having good conductivity are used for the metal layer 13 having a thickness of a few micrometers. On the top side 16 of the housing, the type of the semiconductor component 2 or other company features can be impressed at any time into the shielding layer composed of a closed metal layer 7. In this first embodiment, the edge regions 18 of the wiring substrate 17 project slightly beyond the areal extent of the plastic 10 of the plastic housing 1.

External contact areas 5, which carry the external contacts 6, are arranged on the underside 4 of the plastic housing 1, the underside being formed by the underside 22 of the wiring substrate 17. In this case, the areal extent of the external contact areas 5 is greater than the contact region with the external contacts 6 in order likewise to protect the semiconductor component 2 against electromagnetic interference from the underside 4 of the semiconductor component 2. Only short regions of an insulation layer 26 surround the external contact areas 5 in order to electrically isolate the individual external contact regions from one another.

In order that the external contacts 6, which in this embodiment comprise solder balls, are nevertheless prevented from distributing their solder material on the large-area external contact areas 5, the underside 22 of the wiring substrate 17 comprises a soldering resist layer 27, which delimits the area of contact of the external contacts 6. FIG. 6 also shows that a ground potential 11 is connected to the closed metal layer 7 on the plastic external faces 3 of the semiconductor component 2 at least via one of the external contacts 6.

FIGS. 7 to 10 show schematic cross sections through components during the production of a semiconductor component 30 of a second embodiment. Components having the same functions as in the previous figures are identified by the same reference symbols and are not discussed separately.

Figure 7:
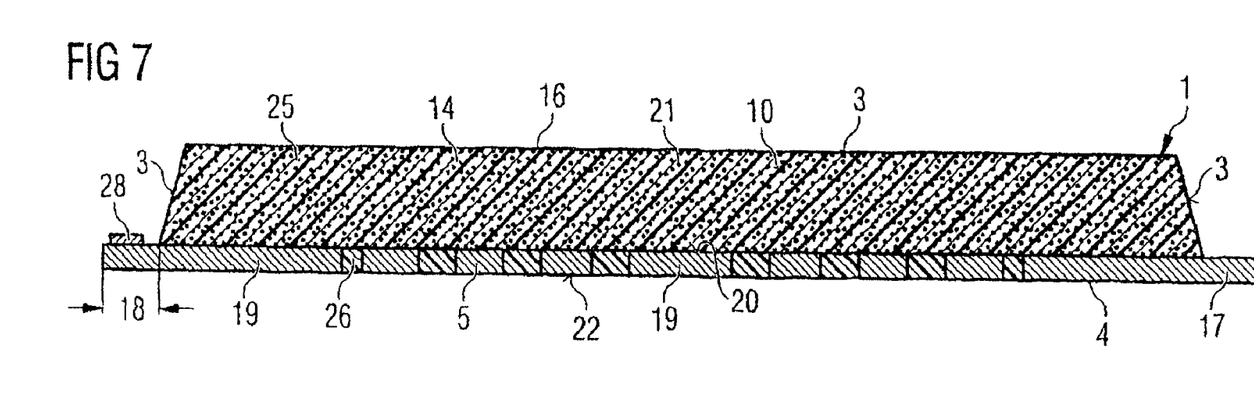
FIG. 7 shows a schematic cross section through a wiring substrate with an applied plastic housing composition.

FIG. 7 shows a schematic cross section through a wiring substrate 17 with applied plastic housing composition 21. The edge regions 18 of the wiring substrate 17 are made wider than in the first embodiment in accordance with FIG. 6 and comprise an additional contact pad 28 on the top side 20 of the wiring substrate 17. The contact pad 28 is provided in order that the closed metal layer that is subsequently to be produced is reliably connected to a ground potential. The plastic housing composition 21, which also covers the edge region 18 of the wiring substrate 17, comprises a plastic 10 in which metal complexes 14 are arranged such that they are uniformly distributed and isolated from one another.

Figure 8:
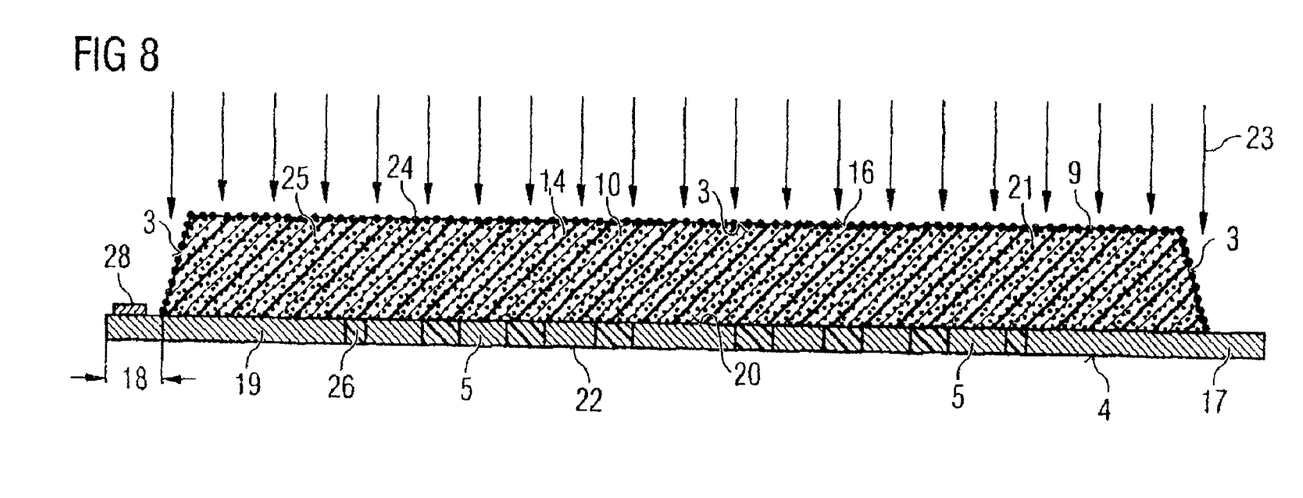
FIG. 8 shows a schematic cross section through the components, in accordance with FIG. 7, during the irradiation of the top sides of the plastic housing composition.

FIG. 8 shows a schematic cross section through the components, in accordance with FIG. 7, during the irradiation of the plastic external faces 3. The irradiation 23 can be a laser radiation, a UV irradiation, an ion irradiation and/or an x-ray irradiation. The type of irradiation 23 depends on the type of metal complexes 14 in the plastic 10 of the plastic housing composition 21. The irradiation is intended, on the one hand, to superficially remove the plastic 10 of the plastic housing composition 21 and, on the other hand, to emit so much energy into the metal complexes 14 that the metals or the conductive inclusions 9 in the metal complexes 14 are released at the surface of the plastic housing composition 21. This gives rise to the arrangement—shown in FIG. 8—of individual liberated metal-containing inclusions 9 which are isolated from one another and which cover the plastic external faces 3 as conductive positions 24.

Figure 9:
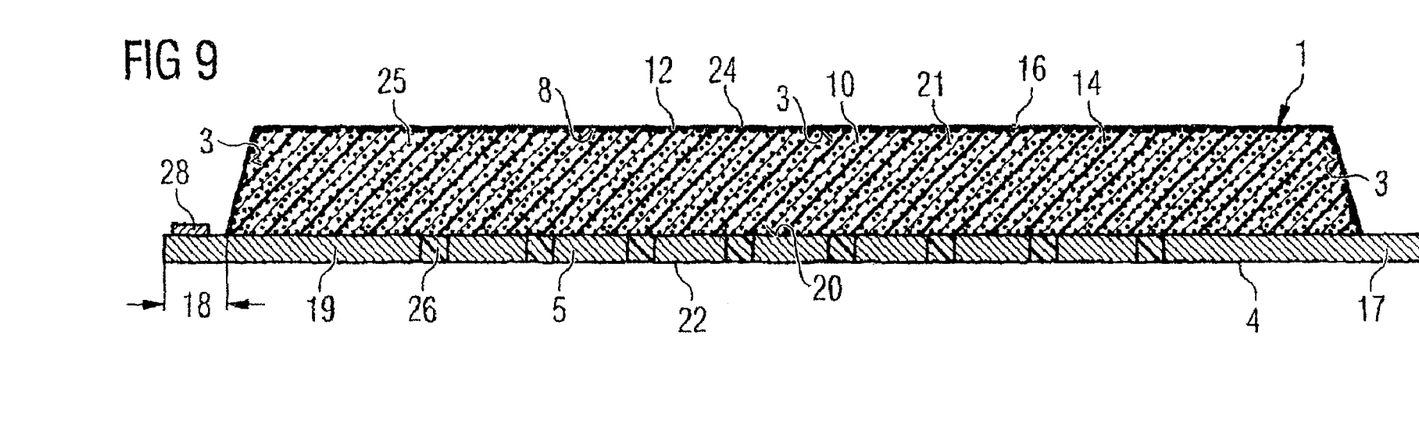
FIG. 9 shows a schematic cross section through the components, in accordance with FIG. 8, after the application of a first metal layer.

FIG. 9 shows a schematic cross section through the components, in accordance with FIG. 8, after the application of a first metal layer 12. The first metal layer 12 connects the conductive positions 24 arranged in an isolated fashion in the boundary layer 8 to one another and can be applied to the plastic external faces 3 via sputtering technology or a plasma method. On account of the released electrically conductive inclusions 9 in the boundary layer 8, the closed first metal layer 12, having a thickness of a few nanometers, adheres on the plastic housing composition 21.

Figure 10:
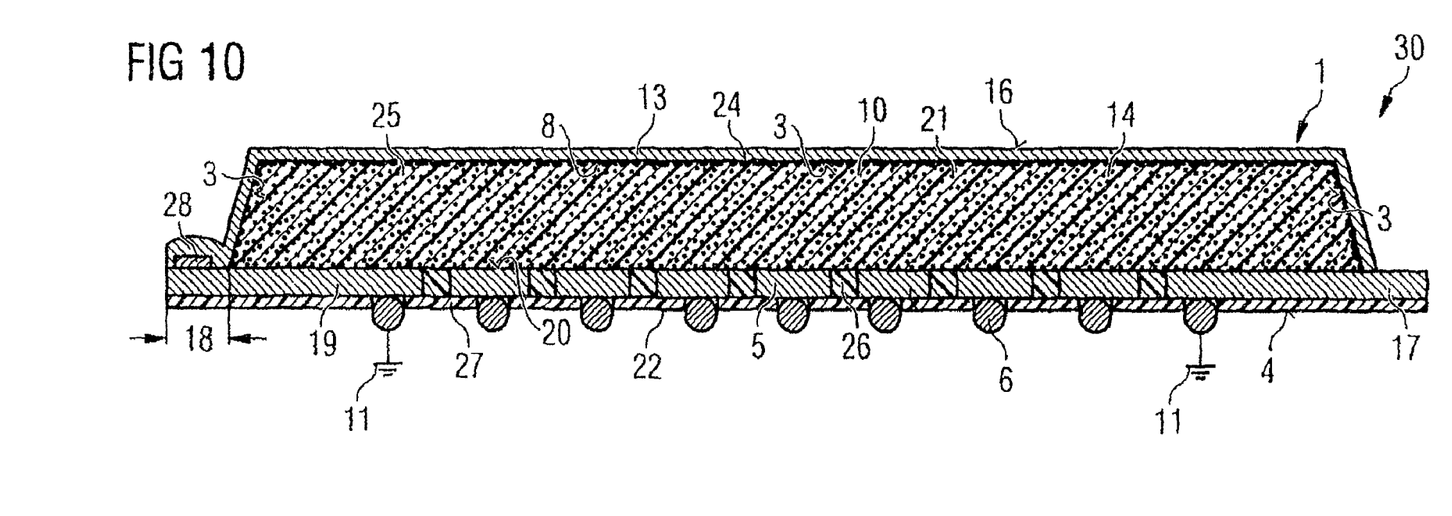
FIG. 10 shows a schematic cross section through the components, in accordance with FIG. 9, after the application of a second metal layer.

FIG. 10 shows a schematic cross section through the components, in accordance with FIG. 9, after the application of a second metal layer 13 having a thickness of several micrometers. In this case, the thick metal layer 13 is simultaneously led at least over the edge region 18 on which the contact pad 28 is situated, such that the metal layer 13 having a thickness of several micrometers is then electrically connected to the contact pad 28. For its part, the contact pad 28 is connected via a through contact and via a large-area external contact area 19 and to an external contact 6 at ground potential 11, such that the shielding layer having a thickness of several micrometers is then also at ground potential 11.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component comprising:
    a plastic housing surrounding integrated circuits within the housing, wherein the plastic housing comprises a plastic material with electrically conductive inclusions and plastic external faces;
    a closed metal layer covering the external faces of the plastic housing;
    a boundary layer disposed between the external faces of the plastic housing and the closed metal layer, the boundary layer comprising exposed electrically conductive inclusions of the plastic material wherein the exposed electrically conductive inclusions of the boundary layer combine to form a lower metal layer beneath the closed metal layer; and
    external contact areas with external contacts arranged on an underside of the component.

2. The electronic component of claim 1, wherein the closed metal layer is configured to be connected to a ground potential.

3. The electronic component of claim 1, further comprising:
    a first metal layer comprising exposed electrically conductive inclusions in the boundary layer, the first metal layer having a thickness of a few nanometers and disposed between the closed metal layer and plastic external faces of the plastic housing.

4. The electronic component of claim 3, wherein the closed metal layer disposed over the first metal layer has a thickness in the micrometer range.

5. The electronic component of claim 1, wherein the exposed electrically conductive inclusions in the boundary layer comprise cleavage products of metal complexes.

6. The electronic component of claim 1, wherein the exposed electrically conductive inclusions of the boundary layer comprise metallic nanoparticles.

7. The electronic component of claim 6, wherein the electrically conductive nanoparticles comprise fullerenes.

8. The electronic component of claim 1, wherein the plastic material of the plastic housing further comprises organometallic compounds including the electrically conductive inclusions.

9. The electronic component of claim 1, wherein the plastic material of the plastic housing further comprises inorganic metal-containing complexes including the electrically conductive inclusions.

10. The electronic component of claim 1, further comprising:
    a wiring substrate disposed on an underside of the plastic housing, the wiring substrate comprising at least one through contact electrically connecting a top side of the wiring substrate to the closed metal layer, the at least one through contact being disposed in an edge region of the wiring substrate;
    wherein the at least one through contact and at least one external contact arranged on the underside of the wiring substrate are configured to electrically connect the closed metal layer to a ground potential.

11. The electronic component of claim 1, wherein the electrically conductive inclusions within the plastic housing are electrically isolated from each other.

12. A plastic housing for an electronic component, the plastic housing comprising:
- a plastic material with electrically conductive inclusions and plastic external faces;
- a closed metal layer covering the plastic external faces;
- a boundary layer disposed between the plastic external faces and the closed metal layer, the boundary layer comprising exposed electrically conductive inclusions of the plastic material, wherein the exposed electrically conductive inclusions of the boundary layer combine to form a lower metal layer beneath the closed metal layer; and
- external contact areas with external contacts arranged on an underside of the component.

13. The plastic housing of claim 12, the inclusions comprise an organometallic compound with metallic constituents that are exposed in the boundary layer and covered by the closed metal layer.

14. The plastic housing of claim 12, wherein the inclusions comprise electrically conductive carbon nanoparticles that are partially exposed in the boundary layer and are covered by the closed metal layer.

15. The plastic housing of claim 14, wherein the electrically conductive nanoparticles comprise fullerenes.

16. The plastic housing of claim 12, wherein the electrically conductive inclusions within the plastic material are electrically isolated from each other.

* * * * *